US010614894B2

(12) United States Patent
Nguyen et al.

(10) Patent No.: US 10,614,894 B2
(45) Date of Patent: Apr. 7, 2020

(54) SELECT GATES SEPARATION FOR IMPROVING PERFORMANCE IN THREE-DIMENSIONAL NON-VOLATILE MEMORY

(71) Applicant: SanDisk Technologies LLC, Plano, TX (US)

(72) Inventors: Qui Vi Nguyen, San Jose, CA (US); Jong Hak Yuh, Pleasanton, CA (US); Khanh Nguyen, San Ramon, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 15/870,269

(22) Filed: Jan. 12, 2018

(65) Prior Publication Data
US 2019/0221269 A1 Jul. 18, 2019

(51) Int. Cl.
G11C 16/04 (2006.01)
G11C 16/30 (2006.01)
G11C 16/26 (2006.01)
G11C 11/56 (2006.01)

(52) U.S. Cl.
CPC .......... G11C 16/30 (2013.01); G11C 11/5642 (2013.01); G11C 16/0483 (2013.01); G11C 16/26 (2013.01)

(58) Field of Classification Search
CPC ...... G11C 16/26; G11C 16/0483; G11C 16/30
See application file for complete search history.

(56) References Cited

U.S. PATENT DOCUMENTS

| 6,466,478 | B1 * | 10/2002 | Park | G11C 16/08 |
| | | | | 365/185.11 |
| 6,552,932 | B1 | 4/2003 | Cernea | |
| 8,199,576 | B2 | 6/2012 | Fasoli et al. | |
| 9,627,046 | B2 | 4/2017 | Louie et al. | |
| 2011/0122697 | A1 * | 5/2011 | Jang | G11C 16/0483 |
| | | | | 365/185.12 |
| 2014/0036590 | A1 * | 2/2014 | Feeley | G11C 16/0483 |
| | | | | 365/185.11 |
| 2016/0314833 | A1 * | 10/2016 | Lee | G11C 11/5635 |

OTHER PUBLICATIONS

Aritome, "NAND Flash Memory Technologies," 2016, 4 pages, John Wiley & Sons, Inc., Hoboken, New Jersey.
Jha, et al., "Nanoelectronic Circuit Design," 2011, 4 pages, Springer-Verlag New York.
Micheloni, "3D Flash Memories," 2016, 2 pages, Springer Netherlands.

* cited by examiner

Primary Examiner — Ajay Ojha
(74) Attorney, Agent, or Firm — Vierra Magen Marcus LLP

(57) ABSTRACT

Disclosed includes a memory device and a method of operating the memory device. A voltage is applied to a word line coupled to first memory transistors of a first plurality of strings of transistors and second memory transistors of a second plurality of strings of transistors. A current flow through one or more of the first plurality of strings of transistors is enabled, while applying the voltage to the word line. A current flow through the second plurality of strings of transistors is disabled by floating source terminals and drain terminals of the second memory transistors, while enabling the current flow through the one or more of the first plurality of strings of transistors.

21 Claims, 7 Drawing Sheets

600

```
Applying a voltage to a word line coupled to first memory cells and
second memory cells
610
```
↓
```
Enabling a current flow through one or more of first plurality of strings
620
```
↓
```
Enabling a current flow through one or more of the second plurality of
strings
630
```
↓
```
Reading states stored by the memory device based on the current flow
through the one or more of the first plurality of strings and the current
flow through the one or more of the second plurality of strings
640
```

```
Applying a voltage to a word line coupled to first memory cells and
second memory cells
710
```
↓
```
Enabling a current flow through one or more of first plurality of strings,
while applying a voltage to the word line
720
```
↓
```
Floating source terminals and drain terminals of memory cells of
second plurality of strings
730
```
↓
```
Reading states stored by the memory device based on the current flow
through the one or more of the first plurality of strings
740
```

FIG. 7

SELECT GATES SEPARATION FOR IMPROVING PERFORMANCE IN THREE-DIMENSIONAL NON-VOLATILE MEMORY

BACKGROUND

The following description is provided to assist the understanding of the reader. None of the information provided or references cited is admitted to be prior art.

Demand for a larger storage capacity of a memory device continues to grow. Increasing storage capacity of a memory device includes increasing a number of memory cells in a memory device.

Increasing a storage capacity may be subject to various trade-offs. For example, increasing a storage capacity results in an increased physical area or volume of the memory device to accommodate a larger number of memory cells. Also, timing or speed of operating the memory device may be extended. For example, reading states (or values) stored by memory cells includes applying electric signals (e.g., pulses, voltages, current, etc.) through conductive lines coupled to the memory cells. However, applying electrical signals to the conductive lines coupled to a larger number of memory cells may cause increased resistance-capacitance (R-C) delays, which result from the higher resistance or capacitance exhibited by the larger number of memory cells. Accordingly, operating the memory device with a larger number of memory cells may suffer from slower operating speed or violation of timing specification.

SUMMARY

Various embodiments disclosed herein are related to a memory device. The memory device includes a first memory string including a first switch, a second switch and a first memory cell coupled between the first switch and the second switch in series. The memory device further includes a second memory string including a third switch, a fourth switch and a second memory cell coupled between the third switch and the fourth switch in series. The memory device further includes a word line coupled to the first memory cell of the first memory string and the second memory cell of the second memory string. The memory device further includes a controller coupled to the word line. The controller is configured to enable a current flow through the first memory string by turning on the first switch and the second switch of the first memory string and by applying a voltage to the word line. The controller is further configured to reduce a capacitance on the word line contributed by a capacitance of the second memory cell of the second memory string, while the voltage is applied to the word line.

In one or more embodiments, the controller is configured to reduce the capacitance on the word line contributed by the capacitance of the second memory cell by turning off the third switch and the fourth switch of the second memory string such that a capacitance between (i) a channel between a source terminal and a drain terminal of the second memory cell and (ii) the word line is reduced.

In one or more embodiments, the device may further include a first control line coupled to the first switch, a second control line coupled to the second switch, a third control line coupled to the third switch, and a fourth control line coupled to the fourth switch. The first control line and the third control line may be disposed in a same row, and the second control line and the fourth control line may be disposed in a same row. The word line may be longer than the first control line, the second control line, the third control line, and the fourth control line.

In one or more embodiments, the word line includes a first word line segment coupled to the first memory cell, and a second word line segment coupled to the second memory cell. The device may further include a switch between the first word line segment and the second word line segment. The switch may be configured to electrically decouple the first word line segment from the second word line segment to reduce the capacitance on the word line contributed by the capacitance of the second memory cell.

Various embodiments disclosed herein are related to a memory device including a first plurality of strings of transistors, each string of the first plurality of strings of transistors comprising a first transistor connected in series to a first memory transistor that is connected in series to a second transistor. The memory device further includes a second plurality of strings of transistors, each string of the second plurality of strings of transistors comprising a third transistor connected in series to a second memory transistor that is connected in series to a fourth transistor. The memory device further includes a word line coupled to the first memory transistor of each string of the first plurality of strings of transistors and the second memory transistor of each string of the second plurality of strings of transistors. The memory device further includes a controller coupled to the word line. The controller is configured to enable a current flow through one or more of the first plurality of strings of transistors by turning on the first transistors and the second transistors of the first plurality of strings of transistors and by applying a voltage to the word line. The controller is further configured to counteract a capacitance on the word line contributed by channel capacitances of the second memory transistors, while the voltage is applied to the word line.

In one or more embodiments, the controller is configured to float drain terminals and source terminals of the second memory transistors by disabling the third transistors and the fourth transistors, while the voltage is applied to the word line during a first mode. The controller may be configured to turn on the first transistors and the second transistors and to apply the voltage to the word line to enable a current flow through one or more of the first plurality of strings of transistors during a second mode. The controller may be configured to turn on the third transistors and the fourth transistors and to apply the voltage to the word line to enable a current flow through one or more of the second plurality of strings of transistors, while turning on the first transistors and the second transistors during the second mode. The capacitance on the word line in the first mode may be less than the capacitance on the word line in the second mode.

In one or more embodiments, the memory device further includes a first control line coupled to the first transistor of each string of the first plurality of strings of transistors, a second control line coupled to the second transistor of each string of the first plurality of strings of transistors, a third control line coupled to the third transistor of each string of the second plurality of strings of transistors, and a fourth control line coupled to the fourth transistor of each string of the second plurality of strings of transistors. The first transistors and the third transistors may be disposed in a first row, and the second transistors and the fourth transistors may be disposed in a second row. The first control line may be separate from the third control line, and the second control line may be separate from the fourth control line.

In one or more embodiments, the controller is coupled to the first control line, the second control line, the third control line, and the fourth control line, and configured to apply the voltage to the word line, while floating drain terminals and source terminals of the second memory transistors of the second plurality of strings of transistors.

In one or more embodiments, the controller includes a first controller coupled to the first control line, the word line and the second control line, and a second controller coupled to the third control line and the fourth control line. The first plurality of strings of transistors and the second plurality of strings of transistors may be disposed between the first controller and the second controller.

In one or more embodiments, the first plurality of strings of transistors and the second plurality of strings of transistors are disposed along a first direction. The first control line, the second control line, the third control line and the fourth control line may be elongated in a second direction. The first control line and the second control line may be parallel with each other, and the third control line and the fourth control line may be parallel with each other. The first transistors may be coupled to corresponding first bit lines and the third transistors may be coupled to corresponding second bit lines. The first bit lines and the second bit lines may be elongated in a third direction different from the first direction and the second direction.

In one or more embodiments, each first memory transistor is disposed between a corresponding first transistor and a corresponding second transistor, and each second memory transistor is disposed between a corresponding third transistor and a corresponding fourth transistor.

Various embodiments disclosed herein are related to a method of operating a memory device including a first plurality of strings of transistors and a second plurality of strings of transistors. The method includes applying a voltage to a word line coupled to first memory transistors of the first plurality of strings of transistors and second memory transistors of the second plurality of strings of transistors during a first mode. The method further includes enabling a current flow through one or more of the first plurality of strings of transistors, while applying the voltage to the word line during the first mode. The method further includes disabling a current flow through the second plurality of strings of transistors by floating source terminals and drain terminals of the second memory transistors, while enabling the current flow through the one or more of the first plurality of strings of transistors in the first mode.

In one or more embodiments, enabling the current flow through the one or more of the first plurality of strings of transistors during the first mode includes turning on first transistors of the first plurality of strings of transistors during the first mode, and turning on second transistors of the first plurality of strings of transistors during the first mode. The first transistors may be disposed in a first row, the first memory transistors and the second memory transistors may be disposed in a second row, and the second transistors may be disposed in a third row.

In one or more embodiments, floating the source terminals and the drain terminals of the second memory transistors during the first mode includes turning off third transistors of the second plurality of strings of transistors during the first mode, and turning off fourth transistors of the second plurality of strings of transistors during the first mode. The first transistors and the third transistors may be disposed in the first row, and the second transistors and the fourth transistors may be disposed in the third row.

In one or more embodiments, the method further includes enabling a current flow through one or more of the first plurality of strings of transistors during a second mode, and enabling a current flow through one or more of the second plurality of strings of transistors, while enabling the current flow through the one or more of the first plurality of strings of transistors during the second mode. A capacitance on the word line in the first mode may be less than a capacitance on the word line in the second mode.

Various embodiments disclosed herein are related to a device. The device includes means for applying a voltage to a word line coupled to first memory transistors of a first plurality of strings of transistors and second memory transistors of a second plurality of strings of transistors. The device further includes means for enabling a current flow through one or more of the first plurality of strings of transistors, while applying the voltage to the word line. The device further includes means for disabling a current flow through the second plurality of strings of transistors by floating source terminals and drain terminals of the second memory transistors, while enabling the current flow through the one or more of the first plurality of strings of transistors.

In one or more embodiments, the means for disabling the current flow through the second plurality of strings of transistors include means for turning off first transistors and second transistors of the second plurality of strings of transistors, while the voltage is applied to the first memory transistors and the second memory transistors through the word line. Each of the second memory transistors may be coupled in series between a corresponding one of the first transistors and a corresponding one of the second transistors.

The foregoing summary is illustrative and is not intended to be in any way limiting. In addition to the illustrative aspects, embodiments, and features described above, further aspects, embodiments, and features will become apparent by reference to the following drawings and the detailed description.

BRIEF DESCRIPTION OF THE DRAWINGS

FIG. 6 is a flow chart illustrating a process of reading states of a memory device in a first read mode according to an example embodiment.

FIG. 7 is a flow chart illustrating a process of reading states of the memory device in a second read mode according to an example embodiment.

Figure 1:
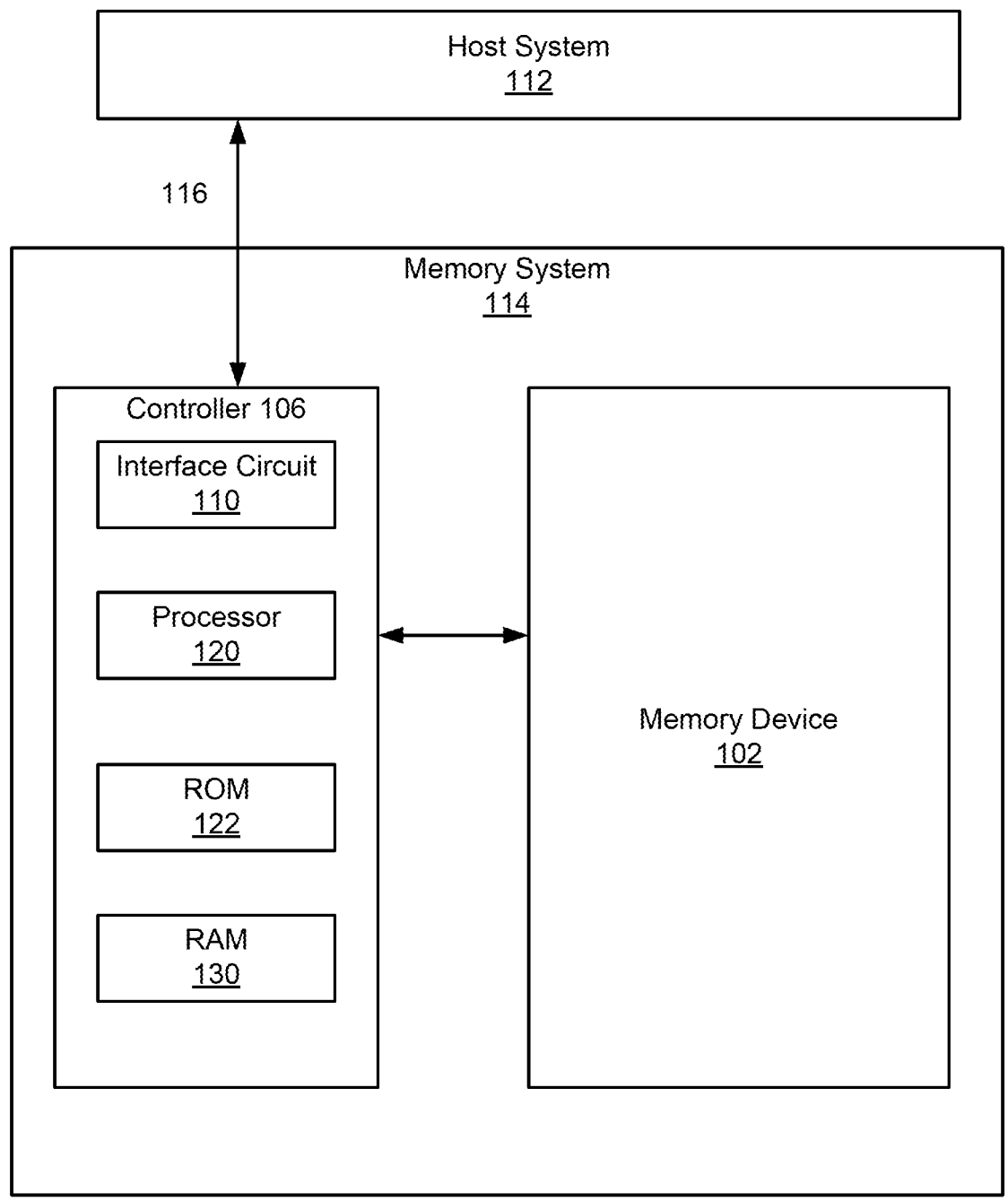
FIG. 1 is a block diagram of a computer system according to an example embodiment.

The foregoing and other features of the present disclosure will become apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

Disclosed herein is a memory device capable of performing a first read mode and a second read mode. In one aspect, the first read mode allows reading of states of a number of memory cells. The second read mode allows reading of states of a smaller number of the memory cells than the number of memory cells used in the first read mode. Advantageously, the second read mode may be performed faster than the first read mode by reducing a capacitance contributed by a subset of the memory cells.

In the first read mode, a voltage is applied to a word line coupled to the memory cells of the memory device, and a current may flow through one or more of the memory cells in response to the applied voltage and states of the memory cells. Thus, states stored by the memory cells can be determined based on the current flow.

In the second read mode, the voltage or the pulse is applied to the word line coupled to the memory cells of the memory device, while drain terminals and source terminals of a first subset of the memory cells are floating. By floating the drain terminals and the source terminals of the first subset of the memory cells, a current may flow through one or more of a second subset of the memory cells in response to the applied voltage or pulse and states of the second subset of the memory cells. In this scenario, current may not flow through the first subset of the memory cells. Thus, states stored by the second subset of the memory cells can be determined based on the current flow, while drain terminals and source terminals of the first subset of the memory cells are floating.

Beneficially, the memory read operation performed in the second read mode can be performed faster than the memory read operation performed in the first read mode. Floating the drain terminals and the source terminals of the first subset of the memory cells reduces the capacitance contributed by the first subset of the memory cells. Accordingly, R-C delay applied to the word line in the second read mode is smaller than R-C delay applied to the word line in the first read mode, thereby enabling the memory read operation performed in the second read mode to be performed faster than that performed in the first read mode.

Although the principle disclosed herein is described in terms of performing a memory read operation, reducing capacitance by floating drain terminals and source terminals of memory cells can be applied to other memory operations (e.g., memory write, reset, etc.). Also, the principle disclosed herein can be applied to other devices (e.g., display panel, a touch sensing panel, etc.) other than a memory device.

FIG. 1 is a block diagram of a computer system 100, according to an example embodiment. The computer system 100 includes a memory system 114 typically operating according to commands from a host system 112. The computer system 100 can be any electronic device such as a personal computer, a server computer, a laptop, a smart phone, a tablet computer, a smart watch, etc. The memory system 114 communicates with the host system 112 through a host interface 116. The memory system 114 may be in the form of a removable memory such as a memory card, or may be in the form of an embedded memory system.

The memory system 114 includes a memory device 102 and a controller 106. The controller 106 controls operations of the memory device 102, according to commands from the host system 112. The memory device 102 comprises one or more arrays of non-volatile memory cells distributed over one or more integrated circuit chips. The controller 106 may include interface circuit 110, processor 120, read-only-memory (ROM) 122, random access memory (RAM) 130, programmable nonvolatile memory 124, and additional components. The controller 106 may be embodied as an application specific integrated circuit, field programmable gate array, other controller embodiments known to those of ordinary skill in the art, or a combination of one or more of these implementations.

The memory device 102 is a hardware component that stores electronic data. In one aspect, the memory device 102 is embodied as a semiconductor memory device including one or more volatile memory devices, such as dynamic random access memory (DRAM) or static random access memory (SRAM) devices, non-volatile memory devices, such as resistive random access memory (ReRAM), electrically erasable programmable read only memory (EEPROM), flash memory (which can also be considered a subset of EEPROM), ferroelectric random access memory (FRAM), and magnetoresistive random access memory (MRAM), other semiconductor elements capable of storing information, or some combination of them.

The memory devices can be formed from passive and/or active elements, in any combinations. In a non-limiting example, passive semiconductor memory elements include ReRAM device elements, which in some embodiments include a resistivity switching storage element, such as an anti-fuse, phase change material, etc., and optionally a steering element, such as a diode, etc. Further, in another non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. In a non-limiting example, flash memory devices in a NAND configuration (NAND memory) may contain memory elements connected in series. The NAND memory array may be configured so that the array includes one or more memory strings in which a string includes multiple memory elements that share a single bit line. Alternatively, memory elements may be configured so that each element is individually accessible, e.g., a NOR memory array. NAND and NOR memory configurations are exemplary, and memory elements may be configured otherwise.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

In a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

In a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry may be implemented for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

It will be recognized that the following is not limited to the two dimensional and three dimensional exemplary structures described but cover all relevant memory structures within the spirit and scope as described herein.

Figure 2:
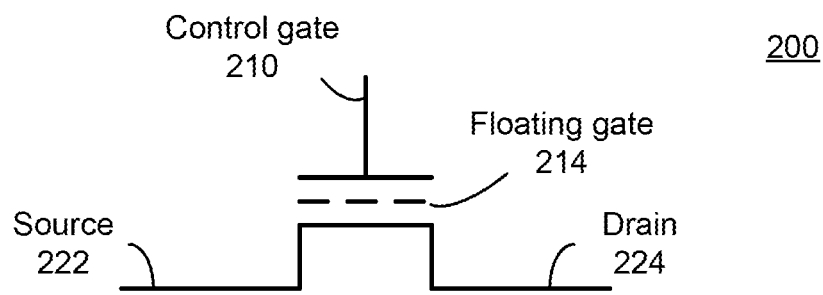
FIG. 2 is a circuit representation of a memory cell of the memory system according to an example embodiment.

FIG. 2 is a circuit representation of a memory cell 200 of the memory system 114. The memory cell 200 can be implemented by a field-effect transistor having a floating gate 214 or a charge trapping (dielectric) layer. The memory cell 200 also includes a source terminal 222, a drain terminal 224, and a control gate terminal 210.

Programming a memory cell 200 may be performed by storing charges at the floating gate 214. In one approach, a hot electron injection technique is used to program the memory cell 200. Hot electron injection results from an accelerating potential built up in the substrate. When an electron having an energy greater than the energy barrier (e.g., 3.1 eV for silicon), the electron passes into the floating gate 214. One method to provide hot electron injection is by having a forward-biased PN junction in the well. Electron injection can be achieved by applying, for example, a voltage which is greater than the energy barrier (e.g., 3.1 eV). The electric field accelerates the electrons to a sufficient energy to reach the floating gate 214 of the memory cell. According to the charges stored by the floating gate 214, a threshold voltage of the memory cell 200 may change.

Reading a state of a memory cell 200 may be performed by sensing the conduction current across the source terminal 222 and drain terminal 224 when a reference voltage is applied to the control gate terminal 210. The memory cell 200 may conduct current by turning on the memory cell 200. Turning on the memory cell 200 may include applying a voltage to a gate terminal of the memory cell 200. According to a threshold of the memory cell 200, or charges on the floating gate 214, a corresponding conduction current with respect to a fixed reference control gate voltage may be detected. Similarly, the range of charge programmable onto the floating gate 214 defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (e.g., a cell-read reference current). In one implementation the detection of the conduction current relative to a threshold current is accomplished by examining the rate of the conduction current discharging through the capacitance of the bit line.

Figure 3:
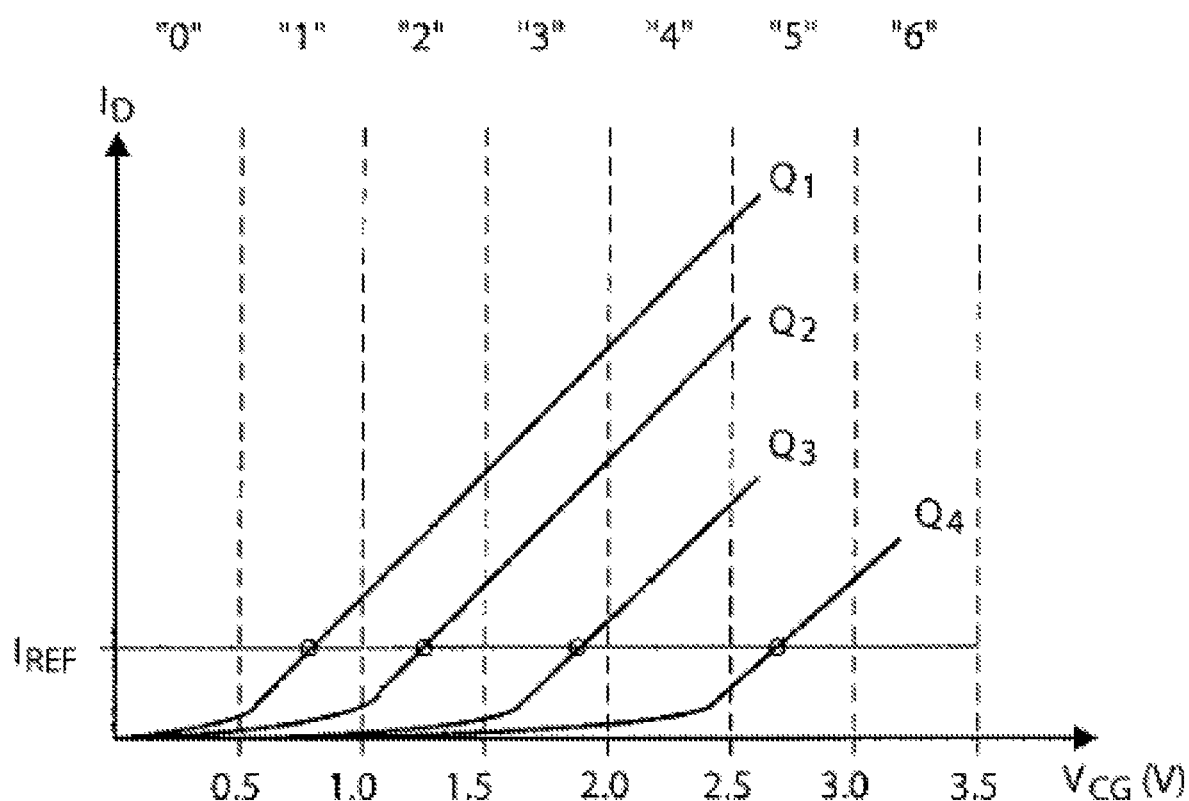
FIG. 3 is a plot illustrating a relation between a source-drain current and a control gate voltage, according to a charged stored by a floating gate of the memory cell of an example embodiment.

FIG. 3 illustrates the relationship between the source-drain current $I_D$ and the control gate voltage $V_{CG}$ for four different charges Q1-Q4 that the floating gate 214 may be selectively storing at any one time. With fixed drain voltage bias, the four solid $I_D$ versus $V_{CG}$ curves represent four of seven possible charge levels that can be programmed on a floating gate 214 of a memory cell, respectively corresponding to four possible memory states. As an example, the threshold voltage window of a population of cells may range from 0.5V to 3.5V. Seven possible programmed memory states "0", "1", "2", "3", "4", "5", "6", and an erased state (not shown) may be demarcated by partitioning the threshold window into regions in intervals of 0.5V each. For example, if a reference current, $I_{REF}$ of 2 µA is used as shown, then the cell programmed with $Q_1$ may be considered to be in a memory state "1" since its curve intersects with $I_{REF}$ in the region of the threshold window demarcated by $V_{CG}$ between 0.5V and 1.0V. Similarly, Q4 is in a memory state "5".

Figure 4:
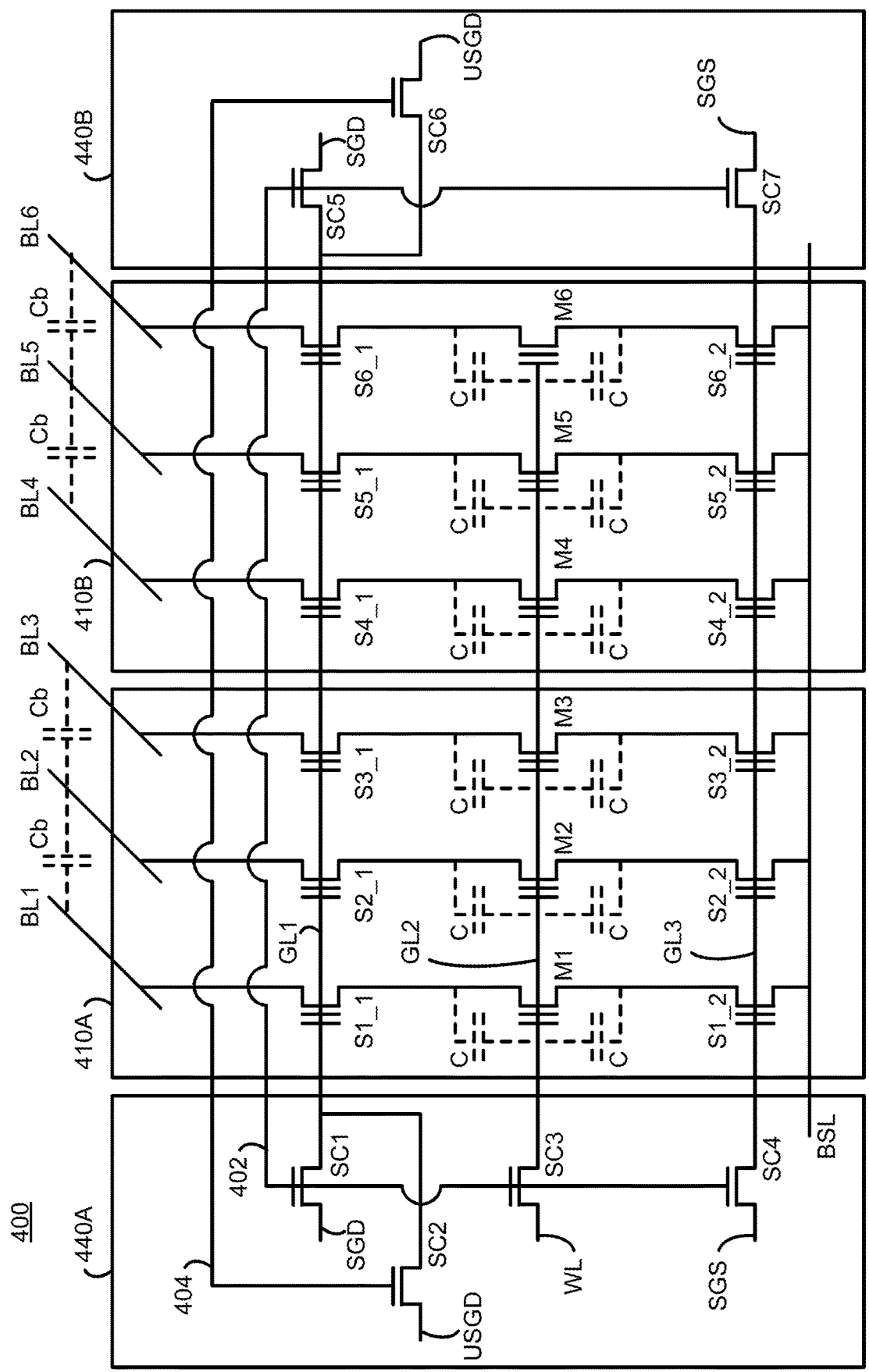
FIG. 4 is an equivalent circuit diagram of a portion of the memory device according to an example embodiment.

FIG. 4 depicts an equivalent circuit diagram of a portion of a memory device 400 in accordance with an example embodiment. The portion of the memory device 400 may be a slice (or a page) of a 3-D memory device 102 of FIG. 1. The memory device 400 includes a plurality of memory strings and controllers 440A, 440B. The plurality of memory strings store values, and the controllers 440A, 440B provide voltages or current to the memory strings for storing and reading values. The controllers 440A, 440B may internally generate various signals and voltages disclosed herein, and provide the signals or voltages to the memory strings. Alternatively, the controller 440A, 440B may receive some or all signals or voltages disclosed herein from an external component and provide the externally provided signals or voltages to the memory strings. In some embodiments, the memory device 400 includes a different number of controllers 440. For example, although two controllers 440A, 440B are shown in FIG. 4, the controllers 440A, 440B may be implemented as a single integrated controller in some embodiments.

Each memory string includes at least a memory cell for storing a value and one or more switches connected in series. The memory cell may be implemented as a memory transistor M (e.g. M1-M6). A switch may be any circuit component that selectively enables or prevents current from flowing through a memory cell. Different switches may be configured to selectively supply voltage or current to one or more memory cells. In one embodiment, the switch is implemented by a transistor. A transistor implemented as a switch is herein referred to as a switch transistor. In one embodiment, the memory strings include a plurality of strings of transistors in NAND configuration (referred to herein as "NAND strings"), controllers 440A, 440B, bit lines BL (e.g., bit lines BL1, BL2, BL3, BL4, B5, and BL6) and control lines GL (e.g., control lines GL1, GL2, GL3). The bit lines BL extend along a first direction, the NAND strings extend along a second direction and the control lines GL extend along a third direction. In an embodiment, the first direction, second direction, and third direction are each orthogonal to one another. In the example shown in FIG. 4, six NAND strings are shown, where three NAND strings coupled to bit lines BL1, BL2, BL3 constitute a first portion 410A of a page and three NAND strings coupled to bit lines BL4, BL5, BL6 constitute a second portion 410B of the same page. In other embodiments, the memory device 400 may include any number of pages, any number of portions in a page, a different number of NAND strings, a different number of control lines, a different number of bit lines.

Each NAND string includes a plurality of transistors daisy chained in series. The transistors in a NAND string may be implemented as a same type of transistor (e.g., N-type field effect transistor). Alternatively, the transistors in the NAND string may be implemented as different types of transistor.

In one configuration, an $n^{th}$ NAND string includes a switch transistor S(n_1), a memory cell M(n), a switch transistor S(n_2) coupled between a bit line BL(n) and a source line BSL. For example, the first NAND string includes, between a bit line BL1 and a source line BSL, a switch transistor S1_1, a memory cell M1, a switch transistor S1_2 daisy chained in series in that sequence.

In one aspect, the memory cell M(n) includes a gate terminal coupled to a control line GL2. The memory cell M(n) may be the memory cell of 210, and programmed by storing charges (or varying a threshold voltage Vth) according to hot electron injection techniques through the control line GL2 (also referred to as "a word line GL2" or "a wordline GL2"). A word line may be any conductive line coupled to control terminals or gate terminals of memory cells to control a voltage or current supplied to store values in the memory cells or to read values stored by the memory cells. The switch transistor S(n_1) includes a gate terminal coupled to a control line GL1. The switch transistor S(n_1) may be enabled (or turned on) to couple a drain terminal of the memory cell M(n) to the bit line BL(n) or disabled (or turned off) to decouple the drain terminal of the memory cell M(n) from the bit line BL(n) according to a voltage applied at the gate terminal through the control line GL1. The switch transistor S(n_2) includes a gate terminal coupled to the control line GL3, and is enabled (or turned on) to couple a source terminal of the memory cell M(n) to the source line BSL or disabled (or turned off) to decouple the source terminal of the memory cell M(n) from the source line BSL, according to a voltage applied to the gate terminal through the control line GL3. In some embodiments, each NAND string includes a different number of transistors than shown in FIG. 4. In some embodiments, one or more transistors in a NAND string may be implemented by other switch components.

The controller 440A is a hardware circuit that operates the transistors of the NAND strings in the first portion 410A of the page. In one embodiment, the controller 440A includes a control transistor SC1 coupled to the control line GL1, a control transistor SC2 coupled to the control line GL1, a control transistor SC3 coupled to the word line GL2, and a control transistor SC4 coupled to the control line GL3. In one aspect, the control transistors SC1, SC3, SC4 each include gate terminals coupled to a select control line 402. Similarly, the control transistor SC2 includes a gate terminal coupled to an unselect control line 404. In this configuration, according to a voltage applied to its gate terminal through the select control line 402, the control transistor SC1 applies a signal SGD to the control line GL1. Similarly, according to a voltage applied to its gate terminal through the unselect control line 404, the control transistor SC2 applies a signal USGD to the control line GL1. According to the voltage applied to each of their gate terminals through the select control line 402, the control transistors SC3, SC4 apply signals WL, SGS to the control lines GL2, GL3, respectively.

A signal SGD is a signal to enable or disable transistors coupled to control line GL1. For example, a signal SGD having a voltage corresponding to logic '1' causes the transistors S(n_1) to turn on to electrically couple the corresponding bit lines BL(n) to corresponding memory cells M(n), and the signal SGD having a voltage corresponding to logic '0' causes the transistors S(n_1) to turn off to electrically decouple the corresponding bit lines BL(n) from corresponding memory cells M(n). Similarly, a signal SGS is a signal to enable or disable transistors coupled to control line GL3. For example, a signal SGS having a voltage corresponding to logic '1' causes the transistors S(n_2) to turn on to electrically couple the source line BSL to corresponding memory cells M(n), and the signal SGS having a voltage corresponding to logic '0' causes the transistors S(n_2) to turn off to electrically decouple the source line BSL from corresponding memory cells M(n). A signal WL is a signal to apply varying levels of voltages to transistors coupled to word line GL2 to perform memory read or memory write operation. For example, a high voltage (e.g., a voltage higher than 3.1 eV) of the signal WL may be applied to the memory cells M(n) through the word line GL2 to perform hot electron injection, and a different voltage of the signal WL may be applied to the memory cells M(n) through the word line GL2 to perform memory read operation.

The controller 440B is a hardware circuit that operates the transistors of the NAND strings in the second portion 410B of the page. In one embodiment, the controller 440B includes a control transistor SC5 coupled to the control line GL1, a control transistor SC6 coupled to the control line GL1, and a control transistor SC7 coupled to the control line GL3. In one aspect, the control transistors SC5, SC7 each include gate terminals coupled to the select control line 402. Similarly, the control transistor SC6 includes a gate terminal coupled to the unselect control line 404. In this configuration, according to the voltage applied to its gate terminal through the select control line 402, the control transistor SC5 applies the signal SGD to the control line GL1. Similarly, according to the voltage applied to its gate terminal through the unselect control line 404, the control transistor SC6 applies the signal USGD to the control line GL1. According to the voltage applied to gate terminal through the select control line 402, the control transistor SC7 applies signal SGS to the control line GL3.

In the embodiment shown in FIG. 4, gate terminals of transistors in a same row in the portions 410A, 410B are coupled to each other through a corresponding control line. For example, gate terminals of transistors S1_1, S2_1, S3_1, S4_1, S5_1, S6_1 are coupled to each other through the single control line GL1. For another example, gate terminals of memory cells M1, M2, M3, M4, M5, M6 are coupled to each other through the single word line GL2. For another example, gate terminals of transistors S1_2, S2_2, S3_2, S4_2, S5_2, S6_2 are coupled to each other through the single control line GL3. Thus, the controller 440B may be omitted.

One aspect of reading states stored by the memory cells M includes applying voltage signals SGD, WL, SGS through the control lines GL1, GL2, GL3, respectively. When the voltage signals SGD, WL, SGS are applied, depending on threshold voltages programmed on the memory cells M, current may flow through one or more of the NAND strings. Specifically, current may flow through a NAND string with a memory cell M programmed with a low threshold voltage. Conversely, current may not flow through a NAND string with a memory cell M programmed with a high threshold voltage.

Each memory cell M includes a capacitance C (shown in dashed line) between the word line GL2 and a channel of the memory cell M. The capacitance C may not be a discrete capacitor component added to the memory cell M, but may include parasitic components such as a gate-drain capacitance, a gate-source capacitance, and a channel capacitance of a memory cell. When the voltage signal WL is applied to the word line GL2, the capacitance C may introduce R-C delay. As the number of memory cells coupled to the word line GL2 increases, R-C delay of the voltage signal WL applied to gate terminals of the memory cells M increases. When a page includes, for example, 16 kB of memory cells M, performing read operations of the entire page or a portion of the page may be slowed due to the R-C delay of the voltage signal WL applied to gate terminals of the memory cells M.

Figure 5A:
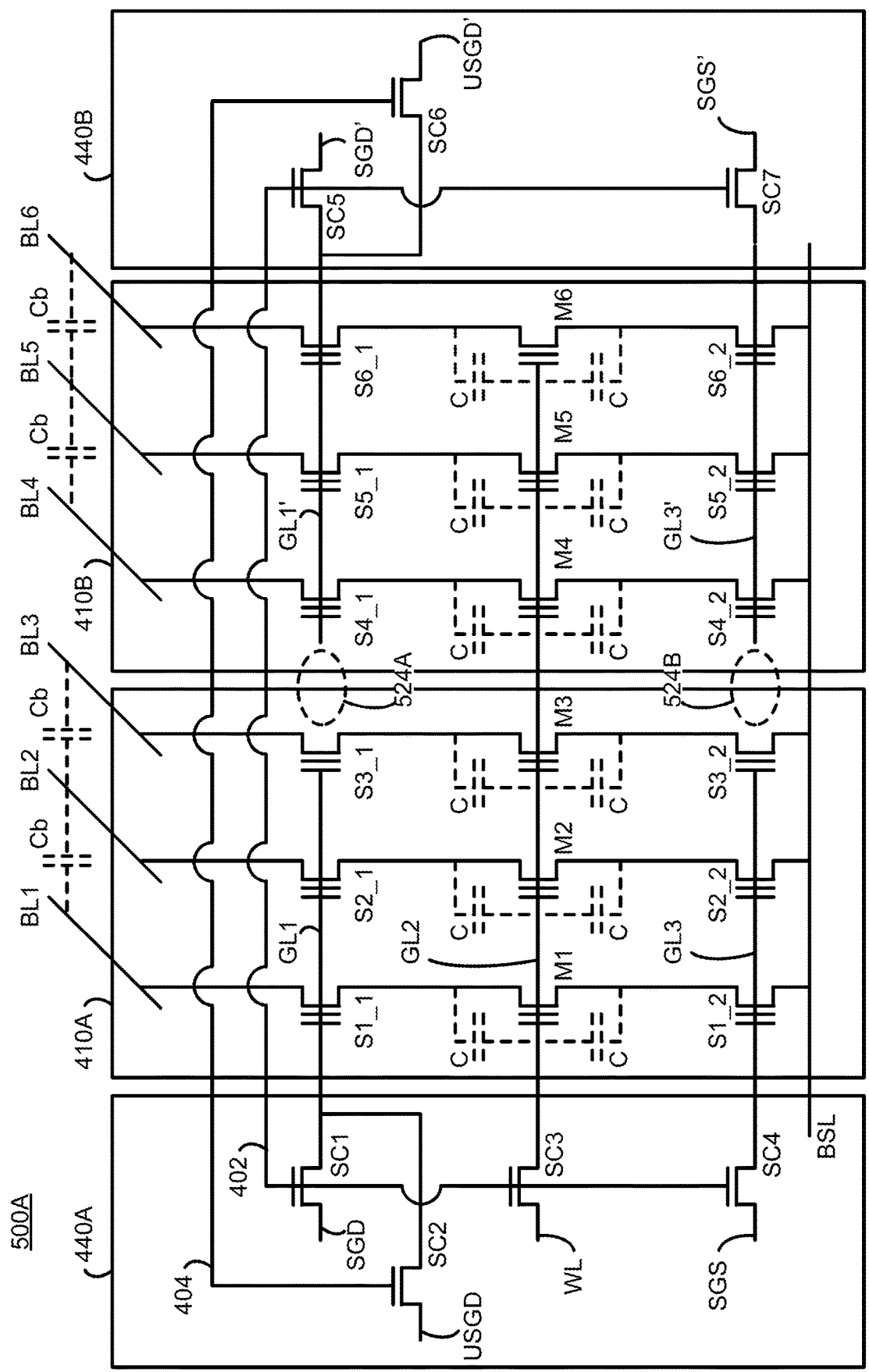
FIG. 5A is an equivalent circuit diagram of a portion of the memory device with segmented control lines operating in a first read mode according to an example embodiment.

Referring to FIG. 5A, illustrated is an equivalent circuit diagram of a portion of a memory device 500A with segmented (e.g., separate) control lines, according to an example embodiment. The memory device 500A may be the memory device 102 of FIG. 1. The memory device 500A is similar to the memory device 400 shown in FIG. 4, except switch transistors in the first portion 410A and the second portion 410B are controlled by segmented control lines. Specifically, the switch transistors SC4_1, SC5_1, SC6_1 are coupled to the control line GL1' and the switch transistors SC4_2, SC5_2, SC6_2 are coupled to the control line GL3'. The control line GL1' is coupled to the control transistor SC5 to apply a signal SGD' or the control transistor SC6 to apply a signal USGD', and the control line GL3' is coupled to the control transistor SC7 to apply a signal SGS'. In this embodiment, the control lines GL1 and GL1' are in a same row, but segmented from each other. Similarly, the control lines GL3 and GL3' are in a same row, but segmented from each other. The control lines GL1 and GL3 may be parallel with each other and the control lines GL1' and GL3' may be parallel with each other. The word line GL2 extends across the first portion 410A and the second portion 410B, such that the word line GL2 is disposed between the control lines GL1, GL3 of the first portion 410A and is disposed between control lines GL1' and GL3' of the second portion 410B. Hence, the word line GL2 is longer than the control lines GL1, GL3, GL1', GL3'. Remaining configuration of the memory device 500A is same as the memory device 400 shown in FIG. 4. Thus, the detailed description of the duplicative portion is omitted herein for the sake of brevity.

In one aspect, the memory device 500A includes a first control line (e.g., control line GL1) coupled to the first switch (e.g., switch transistor S3_1), a second control line (e.g., control line GL3) coupled to the second switch (e.g., switch transistor S3_2), a third control line (e.g., control line GL1') coupled to the third switch (e.g., switch transistor S4_1), and a fourth control line (e.g., control line GL3') coupled to the fourth switch (e.g., switch transistor S4_2). Because the first control line (e.g., control line GL1) is separated from the third control line (e.g., control line GL1'), the memory device 500A includes a first break 524A between the first control line (e.g., control line GL1) and the third control line (e.g., control line GL1') such that an electrical signal is not traversable between the first control line (e.g., control line GL1) and the third control line (e.g., control line GL1'). Similarly, because the second control line (e.g., control line GL3) is separated from the fourth control line (e.g., control line GL3'), the memory device 500A includes a second break 524B between the second control line (e.g., control line GL3) and the fourth control line (e.g., control line GL3') such that an electrical signal is not traversable between the second control line (e.g., control line GL3) and the fourth control line (e.g., control line GL3').

In one configuration, the memory device 500A is operable in two modes: a first read mode and a second read mode. The first read mode may be a mode, in which a larger number of memory cells M are read than in the second read mode. The second read mode may be a mode, in which a fewer number of memory cells is read by floating a subset of the memory cells M. For example, the first read mode is a full page read mode to read states of memory cells M in the portions 410A, 410B of a page, where the second read mode is a half-page read mode to read states of memory cells M in a half portion 410A of the page.

In the first read mode, the signals applied by the controller 440B are identical to the signals applied by the controller 440A. Specifically, in the first read mode, the signal SGD is identical to the signal SGD', the signal USGD is identical to the signal USGD', and the signal SGS is identical to the signal SGS'. Hence, in the first read mode, controller 440B applies the signal SGD to the control line GL1' and applies the signal SGS to the control line GL3', while the controller 440A applies the signal SGD to the control line GL1, the signal WL to the word line GL2, and the signal SGS to the control line GL3. Thus, the switch transistors in the portions 410A, 410B of the page are simultaneously turned on. Accordingly, the memory device 500A in the first read mode operates in a similar manner as the memory device 400.

Figure 5B:
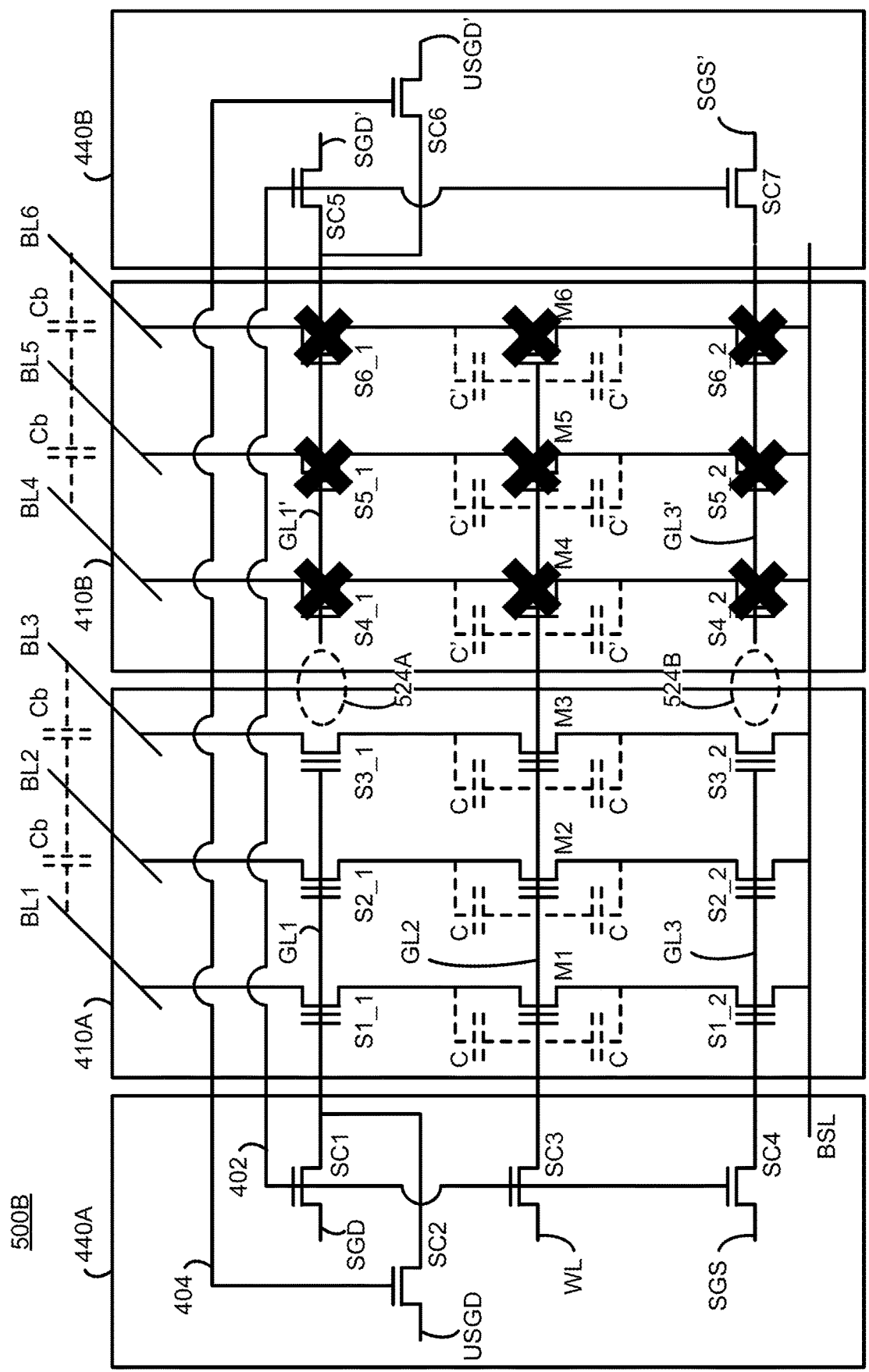
FIG. 5B is an equivalent circuit diagram of the portion of the memory device with segmented control lines operating in a second read mode according to an example embodiment.

Referring to FIG. 5B, illustrated is an equivalent circuit diagram of the portion of the memory device 500B with segmented control lines operating in the second read mode, according to an example embodiment. In the second read mode, the signals applied by the controller 440A and the controller 440B may be different. Specifically, in the second read mode, the signal SGD is different from the signal SGD', the signal USGD is different from the signal USGD', and the signal SGS is different from the signal SGS'. Thus, the switch transistors in the portion 410B of the page may be turned off, while the switch transistors in the portion 410A of the page are turned on. Accordingly, current may flow through one or more of the NAND strings in the first portion 410A of the page according to the programmed memory cells M, but not through any of the NAND strings in the second portion 410B of the page.

In one aspect, the second read mode allows the memory operation to be performed with reduced R-C delay compared to the R-C delay associated with the first read mode shown in FIG. 5A. Specifically, by turning off the switch transistors S(n_1), S(n_2) in the portion 410B, drain terminals and source terminals of the memory cells M in the second portion 410B are floated. Accordingly, contribution to the overall capacitance of the word line GL2 from capacitances (e.g., capacitances C') of second memory cells (e.g., memory cells M4-M6) is reduced. The capacitances C' formed between the word line GL2 and channels of second memory cells M4-M6 in the second portion 410B in the second read mode as shown in FIG. 5B become less than the capacitances C formed between the word line GL2 and channels of the second memory cells M4-M6 in the second portion 410B in the first read mode as shown in FIG. 5A. This is because the drain terminals and the source terminals of the memory cells M4-M6 in the second portion 410B become floated. Thus, the resulting capacitance at the word line GL2 in the second read mode is less than the capacitance at the word line GL2 in the first read mode. Moreover, contribution of capacitances Cb between bit lines of the second portion 410B to the word line GL2 is also reduced. Hence, a capacitance on the word line GL2 can be counteracted by reducing contribution of capacitances C', capacitances between bit lines, or a combination of them. Accordingly, the R-C delay of applying the signal WL in the second read mode is reduced when compared to the embodiment of FIG. 4 where the memory cells M may not be selectively floated. Assuming that the portion 410B includes a same number of memory cells than in the portion 410A, then the capacitance at the word line GL2 in the second read mode becomes approximately 50% of the capacitance at the word line GL1 in the first read mode. Hence, the speed of performing read in the second read mode can be greatly improved.

In some embodiments, the controllers 440A, 440B are means for applying a voltage to a word line coupled to first memory transistors of a first plurality of strings of transistors and second memory transistors of a second plurality of strings of transistors. In addition, the controllers 440A, 440B are means for enabling a current flow through one or more of the first plurality of strings of transistors, while applying the voltage to the word line. In addition, the controllers 440A, 440B are means for disabling a current flow through the second plurality of strings of transistors by floating source terminals and drain terminals of the second memory transistors, while enabling the current flow through the one or more of the first plurality of strings of transistors.

In one or more embodiments, the controllers 440A, 440B are means for turning off first transistors and second transistors of the second plurality of strings of transistors, while the voltage is applied to the first memory transistors and the second memory transistors through the word line. Each of the second memory transistors may be coupled in series between a corresponding one of the first transistors and a corresponding one of the second transistors.

In one aspect, the control lines GL1, GL3 in FIG. 4 are formed by a single mask that is different from a mask to form the word line GL2 coupled to memory cells M. In one approach, control lines GL1', GL3' in FIGS. 5A, 5B may be formed by modifying the single mask to generate the control line GL1, GL3 without altering the mask to form the word line GL2. In another approach, the control lines GL1', GL3' in FIGS. 5A, 5B may be formed by the same mask for forming the control lines GL1, GL3 in FIG. 4, and breaking the control lines GL1, GL3 in FIG. 4, for example, through metal fix process. Accordingly, the memory devices 500A, 500B can be formed in a cost effective way through existing fabrication process to fabricate the memory device 400 of FIG. 4.

Figure 5C:
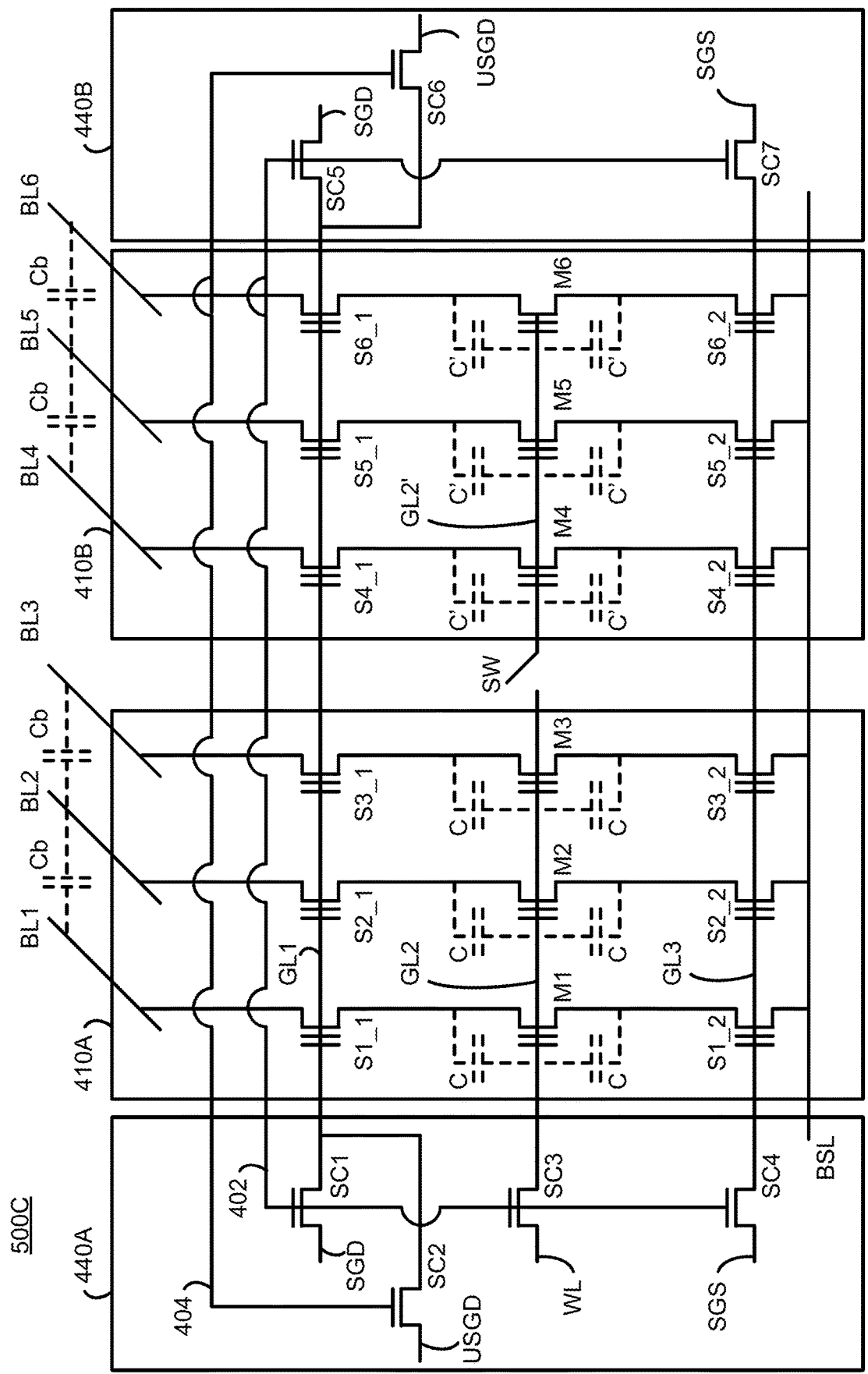
FIG. 5C is another equivalent circuit diagram of the portion of the memory device with segmented control lines according to an example embodiment.

Referring to FIG. 5C, illustrated is another equivalent circuit diagram of the portion of the memory device 500C with segmented control lines according to an example embodiment. The structure of the memory device 500C is similar to the memory device 400, except the word line is segmented into word line segments GL2, GL2' and a switch SW is added between the word line segments GL2, GL2'. The switch SW is a circuit that electrically couples or decouples the word lines GL2, GL2'. The switch SW may be implemented by a transistor. In the first mode, the switch SW electrically couples the word line segments GL2, GL2', such that the memory device 500C operates in a similar manner as 400. In the second mode, the switch SW electrically decouples the word line segments GL2, GL2', such that the contribution to the overall capacitance of the word line GL2 from capacitances (e.g., capacitances C') of second memory cells (e.g., memory cells M4-M6) is reduced. Accordingly, a memory read operation in the second read mode may be performed faster by opening the switch SW than in the first read mode. In other embodiments, the memory device 500C includes three or more word line segments and additional switches SW between corresponding word line segments.

Referring to FIG. 6, illustrated is a flow chart illustrating a process 600 of reading states of a memory device in a first read mode, according to an example embodiment. The process 600 may be performed by the memory device 500A of FIG. 5A. In other embodiments, the process 600 is performed by other entities. In other embodiments, the process 600 includes more, fewer, or different operations than shown in FIG. 6.

The memory device 500A applies a voltage to a word line GL2 coupled to first memory cells and second memory cells in an operation 610. The first memory cells may be memory cells of NAND strings in a first portion of a page (e.g., memory cells M1-M3 in FIGS. 5A and 5B) and the second memory cells may be memory cells of NAND strings in a second portion of the same page (e.g., memory cells M4-M6 in FIGS. 5A and 5B).

The memory device 500A enables a current flow through one or more of the first plurality of strings in an operation 620. In one approach, the memory device 500A turns on switches (e.g., S(n_1)) coupled to drains of the memory cells and switches (e.g., S(n_2)) coupled to sources of the memory cells in the first plurality of strings. Depending on charges stored by the memory cells of the first plurality of strings, current may flow through one or more of the first plurality of strings.

The memory device 500A enables a current flow through one or more of the second plurality of strings in an operation 630. In one approach, the memory device 500A turns on switches (e.g., S(n_1)) coupled to drains of the memory cells and switches (e.g., S(n_2)) coupled to sources of the memory cells in the second plurality of strings, while turning on the switches coupled to the drains of the memory cells and the switches coupled to the sources of the memory cells in the first plurality of strings. Depending on charges stored by the memory cells of the second plurality of strings, current may flow through one or more of the second plurality of strings.

The memory device 500A reads states stored by the first memory cells of the first plurality of strings and the second memory cells of the second plurality of strings based on the current flow through the one or more of the first plurality of strings and the current flow through the one or more of the second plurality of strings in an operation 640. Reading states based on the current flow is performed, for example, as described above with respect to FIG. 3.

Referring to FIG. 7, illustrated is a flow chart illustrating a process 700 of reading states of the memory device in a second read mode, according to an example embodiment. The process 700 may be performed by the memory device 500B of FIG. 5B. In other embodiments, the process 700 is performed by other entities. In other embodiments, the process 700 includes more, fewer, or different operations than shown in FIG. 7.

The operations 710 and 720 are similar to the operations 610, 620 of FIG. 6. Therefore, detailed description thereof is omitted herein for the sake of brevity.

The memory device 500B floats source terminals and drain terminals of memory cells of the second plurality of strings in an operation 730. In one approach, the source terminals and the drain terminals of the memory cells of the second plurality of strings are floated, while the voltage is applied to the word line GL2. By floating the source terminals and the drain terminals of the memory cells of the second plurality of strings, current may not flow through the second plurality of strings while current may flow through one or more of the first plurality of strings. Because the source terminals and the drain terminals of the memory cells of the second plurality of strings are floated, contribution of capacitances between the word line GL2 and channels of the memory cells of the second plurality strings to the word line GL2 is reduced. Accordingly, the R-C delay of applying the signal WL in the second read mode can be reduced.

The memory device 500B reads states stored by the first memory cells of the first plurality of strings based on the current flow through the one or more of the first plurality of strings in an operation 740, for example as described above with respect to FIG. 3.

The preceding description is directed to certain implementations for the purposes of describing the innovative aspects of this disclosure. However, a person having ordinary skill in the art will readily recognize that the teachings herein can be applied in a multitude of different ways. The described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, printers, copiers, scanners, facsimile devices, global positioning system (GPS) receivers/navigators, cameras, digital media players (such as MP3 players), camcorders, game consoles, wrist watches, wearable devices, clocks, calculators, television monitors, flat panel displays, electronic reading devices (such as e-readers), computer monitors, auto displays (such as odometer and speedometer displays), cockpit controls and displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS) applications including microelectromechanical systems (MEMS) applications, in addition to non-EMS applications), aesthetic structures (such as display of images on a piece of jewelry or clothing) and a variety of EMS devices.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm processes described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and processes described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some implementations, particular processes and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Additionally, a person having ordinary skill in the art will readily appreciate, directional terms are sometimes used for ease of describing the figures, and indicate relative positions corresponding to the orientation of the figure on a properly oriented page, and may not reflect the proper orientation of any device as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. A device comprising:
   a first memory string including a first switch, a second switch and a first memory cell coupled between the first switch and the second switch in series;
   a second memory string including a third switch, a fourth switch and a second memory cell coupled between the third switch and the fourth switch in series;
   a word line coupled to the first memory cell of the first memory string and the second memory cell of the second memory string; and
   a controller coupled to the word line, the controller configured to:
      enable a current flow through the first memory string by turning on the first switch and the second switch of the first memory string and by applying a voltage to a gate terminal of the first memory cell and a gate terminal of the second memory cell through the word line, and
      reduce a capacitance on the word line contributed by a capacitance of the second memory cell of the second memory string, while the voltage is applied to the gate terminal of the first memory cell and the gate terminal of the second memory cell through the word line.

2. The device of claim 1, wherein the controller is configured to reduce the capacitance on the word line contributed by the capacitance of the second memory cell by turning off the third switch and the fourth switch of the second memory string such that a capacitance between (i) a channel between a source terminal and a drain terminal of the second memory cell and (ii) the word line is reduced.

3. The device of claim 1, further comprising:
   a first control line coupled to the first switch;
   a second control line coupled to the second switch;
   a third control line coupled to the third switch; and
   a fourth control line coupled to the fourth switch, the first control line and the third control line disposed in a same row, the second control line and the fourth control line disposed in a same row, the word line longer than the first control line, the second control line, the third control line, and the fourth control line.

4. The device of claim 1, wherein the word line includes:
   a first word line segment coupled to the first memory cell, and
   a second word line segment coupled to the second memory cell,
   wherein the device further comprises:
      a switch between the first word line segment and the second word line segment, the switch configured to electrically decouple the first word line segment from the second word line segment to reduce the capacitance on the word line contributed by the capacitance of the second memory cell.

5. A device comprising:
   a first control line coupled to a first switch transistor of a first string of transistors;
   a second control line coupled to a second switch transistor of the first string of transistors;
   a third control line coupled to a third switch transistor of a second string of transistors;

a fourth control line coupled to a fourth switch transistor of the second string of transistors; and a word line directly coupled to a gate terminal of a first memory transistor of the first string of transistors and a gate terminal of a second memory transistor of the second string of transistors, the word line disposed between the first control line and the second control line, and disposed between the third control line and the fourth control line.

6. The device of claim 5, wherein:

the first control line is separated from the third control line, and the second control line is separated from the fourth control line.

7. The device of claim 6, further comprising:

a first break between the first control line and the third control line such that an electrical signal is not traversable between the first control line and the third control line; and a second break between the second control line and the fourth control line such that an electrical signal is not traversable between the second control line and the fourth control line.

8. A device comprising:

a first plurality of strings of transistors, each string of the first plurality of strings of transistors comprising a first transistor connected in series to a first memory transistor that is connected in series to a second transistor;

a second plurality of strings of transistors, each string of the second plurality of strings of transistors comprising a third transistor connected in series to a second memory transistor that is connected in series to a fourth transistor;

a word line coupled to the first memory transistor of each string of the first plurality of strings of transistors and the second memory transistor of each string of the second plurality of strings of transistors; and a controller coupled to the word line, the controller configured to:

enable a current flow through one or more of the first plurality of strings of transistors by turning on the first transistors and the second transistors of the first plurality of strings of transistors and by applying a voltage to gate terminals of the first memory transistors and gate terminals of the second memory transistors through the word line, and counteract a capacitance on the word line contributed by channel capacitances of the second memory transistors, while the voltage is applied to the gate terminals of the first memory transistors and the gate terminals of the second memory transistors through the word line.

9. The device of claim 8, wherein the controller is configured to float drain terminals and source terminals of the second memory transistors by disabling the third transistors and the fourth transistors, while the voltage is applied to the gate terminals of the first memory transistors and the gate terminals of the second memory transistors through the word line during a first mode.

10. The device of claim 9, wherein the controller is configured to turn on the first transistors and the second transistors and to apply the voltage to the gate terminals of the first memory transistors and the gate terminals of the second memory transistors through the word line to enable a current flow through one or more of the first plurality of strings of transistors during a second mode, and wherein the controller is configured to turn on the third transistors and the fourth transistors and to apply the voltage to the gate terminals of the first memory transistors and the gate terminals of the second memory transistors through the word line to enable a current flow through one or more of the second plurality of strings of transistors, while turning on the first transistors and the second transistors during the second mode, the capacitance on the word line during the first mode less than the capacitance on the word line during the second mode.

11. The device of claim 10, wherein:

the second mode is a first read mode, during which values stored by the first memory transistors and the second memory transistors are sensed, and the first mode is a second read mode, during which values stored by the first memory transistors are sensed.

12. The device of claim 8, further comprising:

a first control line coupled to the first transistor of each string of the first plurality of strings of transistors;

a second control line coupled to the second transistor of each string of the first plurality of strings of transistors;

a third control line coupled to the third transistor of each string of the second plurality of strings of transistors, the first transistors and the third transistors disposed in a first row, the first control line separate from the third control line; and a fourth control line coupled to the fourth transistor of each string of the second plurality of strings of transistors, the second transistors and the fourth transistors disposed in a second row, the second control line separate from the fourth control line.

13. The device of claim 12, wherein the controller is further coupled to the first control line, the second control line, the third control line, and the fourth control line, and wherein the controller is further configured to apply the voltage to the word line, while floating drain terminals and source terminals of the second memory transistors of the second plurality of strings of transistors.

14. The device of claim 12, wherein the controller includes:

a first controller coupled to the first control line, the word line and the second control line; and a second controller coupled to the third control line and the fourth control line, the first plurality of strings of transistors and the second plurality of strings of transistors disposed between the first controller and the second controller.

15. The device of claim 12, wherein the first plurality of strings of transistors and the second plurality of strings of transistors are disposed along a first direction, wherein the first control line, the second control line, the third control line, and the fourth control line are elongated in a second direction, the first control line and the second control line being parallel with each other, the third control line and the fourth control line being parallel with each other, and wherein the first transistors are coupled to corresponding first bit lines and the third transistors are coupled to corresponding second bit lines, the first bit lines and the second bit lines elongated in a third direction different from the first direction and the second direction.

16. The device of claim 8,
wherein each first memory transistor is disposed between a corresponding first transistor and a corresponding second transistor, and
wherein each second memory transistor is disposed between a corresponding third transistor and a corresponding fourth transistor.

17. A method comprising:
applying a voltage to gate terminals of first memory transistors of a first plurality of strings of transistors and gate terminals of second memory transistors of a second plurality of strings of transistors through a word line during a first mode;
enabling a current flow through one or more of the first plurality of strings of transistors, while applying the voltage to the gate terminals of the first memory transistors and the gate terminals of the second memory transistors through the word line during the first mode; and
disabling a current flow through the second plurality of strings of transistors by floating source terminals and drain terminals of the second memory transistors, while applying the voltage to the gate terminals of the first memory transistors and the gate terminals of the second memory transistors through the word line during the first mode.

18. The method of claim 17,
wherein enabling the current flow through the one or more of the first plurality of strings of transistors during the first mode includes:
turning on first transistors of the first plurality of strings of transistors during the first mode, and
turning on second transistors of the first plurality of strings of transistors during the first mode, and
wherein the first transistors are disposed in a first row, the first memory transistors and the second memory transistors are disposed in a second row, and the second transistors are disposed in a third row.

19. The method of claim 18, wherein floating the source terminals and the drain terminals of the second memory transistors during the first mode includes:
turning off third transistors of the second plurality of strings of transistors during the first mode, the first transistors and the third transistors disposed in the first row; and
turning off fourth transistors of the second plurality of strings of transistors during the first mode, the second transistors and the fourth transistors disposed in the third row.

20. The method of claim 19, further comprising:
enabling a current flow through one or more of the first plurality of strings of transistors during a second mode; and
enabling a current flow through one or more of the second plurality of strings of transistors, while enabling the current flow through the one or more of the first plurality of strings of transistors during the second mode, a capacitance on the word line during the first mode less than a capacitance on the word line during the second mode.

21. A device comprising:
means for applying a voltage to gate terminals of first memory transistors of a first plurality of strings of transistors and gate terminals of second memory transistors of a second plurality of strings of transistors through a word line;
means for enabling a current flow through one or more of the first plurality of strings of transistors, while applying the voltage to the gate terminals of the first memory transistors and the gate terminals of the second memory transistors through the word line; and
means for disabling a current flow through the second plurality of strings of transistors by floating source terminals and drain terminals of the second memory transistors, while applying the voltage to the gate terminals of the first memory transistors and the gate terminals of the second memory transistors through the word line.

\* \* \* \* \*